(12) United States Patent
Lander

(10) Patent No.: US 8,216,894 B2
(45) Date of Patent: Jul. 10, 2012

(54) FINFET METHOD AND DEVICE

(75) Inventor: Robert J. P. Lander, Leuven (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/999,289

(22) PCT Filed: Jun. 10, 2009

(86) PCT No.: PCT/IB2009/052480
§ 371 (c)(1),
(2), (4) Date: Dec. 15, 2010

(87) PCT Pub. No.: WO2009/153712
PCT Pub. Date: Dec. 23, 2009

(65) Prior Publication Data
US 2011/0089493 A1   Apr. 21, 2011

(30) Foreign Application Priority Data

Jun. 17, 2008 (EP) .................... 08104439
Jun. 10, 2009 (WO) ................. PCT/IB2009/052480

(51) Int. Cl.
*H01L 21/8238* (2006.01)

(52) U.S. Cl. ........ 438/212; 438/197; 438/199; 438/268; 257/206; 257/211; 257/288; 257/384; 257/637

(58) Field of Classification Search .................. 438/197, 438/FOR. 163, FOR. 192, FOR. 174, 199, 438/212, 268; 257/308, 722, E21.014, 204, 257/206, 211, 288, 384, 635, 636, 637
See application file for complete search history.

(56) References Cited

U.S. PATENT DOCUMENTS

| 7,091,068 | B1 | 8/2006 | Ahmed et al. |
| 2004/0113171 | A1 | 6/2004 | Chiu et al. |
| 2005/0258477 | A1 | 11/2005 | Saito |
| 2006/0084247 | A1 | 4/2006 | Liu |
| 2006/0172476 | A1 | 8/2006 | Liao et al. |
| 2006/0177998 | A1 | 8/2006 | Lin et al. |
| 2007/0004117 | A1 | 1/2007 | Yagishita |
| 2007/0052037 | A1 | 3/2007 | Luan |
| 2007/0122984 | A1* | 5/2007 | Zhu et al. ............ 438/285 |
| 2007/0148843 | A1 | 6/2007 | Saito et al. |
| 2007/0173008 | A1 | 7/2007 | Chudzik et al. |
| 2007/0221956 | A1* | 9/2007 | Inaba .................. 257/197 |
| 2008/0258228 | A1* | 10/2008 | Chuang et al. ........ 257/369 |
| 2009/0065853 | A1* | 3/2009 | Hanafi ................. 257/327 |
| 2009/0200604 | A1* | 8/2009 | Chidambarrao et al. ... 257/329 |

FOREIGN PATENT DOCUMENTS

| WO | 2006/103158 | A2 | 10/2006 |
| WO | 2007/031930 | A2 | 3/2007 |
| WO | 2008/015940 | A1 | 2/2008 |

OTHER PUBLICATIONS

Chatterjee, A., et al; "Sub-100NM Gate Length Metal Gate NMOS Transistors Fabricated by a Replacement Gate Process"; IEDM Tech. Digest, p. 821-824 (1997). Chatterjee, A. et al; "CMOS Metal Replacement Gate Transistors Using Tantalum Pentoxide Gate Insulator"; IEDM Tech Digest, p. 777-780 (1998).
Kedzierski, Jakub, et al; "Fabrication of Metal Gated FinFETs Through Complete Gate Silicidation With Ni"; IEEE Transactions on Electron Devices, vol. 51, No. 12; 6 pages (DEC 1004).
International Search Report and Written Opinion for Application PCT/IB2009/052480 (Oct. 21, 2009).

* cited by examiner

Primary Examiner — N Drew Richards
Assistant Examiner — Joannie A Garcia

(57) ABSTRACT

A finFET structure is made by forming a fin (14), followed by a gate stack of gate dielectric (16), metal gate layer (18), polysilicon layer (20) and silicon-germanium layer (22). The gate stack is then patterned, and source and drain implants formed in the fin (14) away from the gate. The silicon germanium layer (22) is selectively etched away, a metal deposited over the gate, and silicidation carried out to convert the full thickness of the polysilicon layer (20) at the top of the fin. A region of unreacted polysilicon (38) may be left at the base of the fin and across the substrate.

8 Claims, 3 Drawing Sheets

FINFET METHOD AND DEVICE

The invention relates to a fin field effect transistor (finFET) together with a method of manufacturing such a transistor.

As CMOS scaling is reduced below the 45 nm node, conventional bulk MOSFETs become less suitable and alternatives are envisaged. In order to reduce short channel effects, gate control over the silicon channel may be enhanced. Two alternative technologies are forseen. Firstly, fully-depleted silicon on insulator (FDSOI) technology may be used, in which planar transistors are built on SOI substrates with extremely thin silicon layers (less than 10 nm). Secondly, multigate FETs (MuGFETs) may be used in which thin silicon channels are controlled by gates from two sides.

For CMOS nodes beyond 32 nm, MuGFETs are seen as the best scaleable option and so much research activity is presently directed in this area.

A particularly attractive MuGFET is the so-called FinFET, with a vertical fin-shaped channel. The advantages are the natural self-alignment of front and back gates, as well as processing that is fairly similar to conventional bulk processing. Such FinFETs may typically be formed from on SOI substrates, though they may also be formed on bulk Si substrates.

In order to reliably obtain the correct threshold voltage in finFETs, it is frequently necessary to deposit thin metal gate electrodes over the gate insulator, typically high-k dielectric. Then, a polysilicon cap is used to protect the thin metal layer from subsequent processing steps, including in particular wet etch steps.

The resulting structure of a polysilicon gate over metal degrades performance since there is a Schottky resistance at the lower metal/polysilicon interface, which severely limits the operating frequency of the transistor.

An alternative would be to use metal silicide instead of metal and polysilicon. One paper which presents examples of a fully silicided gate in a finFET is described in Kedzierski et al, "Fabrication of Metal Gated FinFETs Through Complete Gate Silicidation With Ni", IEEE transactions on electron devices, Volume 51, number 12, December 2004, pages 2115. This uses a complex process with different siliciding processes for the source and drain (which use cobalt silicide) and nickel silicide for the gate. The paper mentions the importance for the method of decoupling of gate and source/drain silicide requirements, as well as the avoiding the need for high temperature annealing.

It would be beneficial to achieve an improved gate electrode without such difficulties and without the Schottky resistance.

According to a first aspect of the invention there is provided a method of making a finFET structure according to claim 1.

In another aspect, the invention relates to the resulting device structure, a finFET structure according to claim 6.

By siliciding the full thickness of the polysilicon of a finFET structure on the top of the fin the metal-semiconductor Schottky barrier between the metal gate and polysilicon is avoided.

This is achieved without the difficulty of prior art processes such as that of Kedzierski et al. In fact, the approach is rather different. Kedzierski et al carry out a complex process to fully silicide the gate over its full length and depth.

Instead, here a silicon-germanium layer is used over the polysilicon layer to provide enough thickness in the gate region to avoid the implantation process used to implant the source and drain at the ends of the fin from significantly implanting the region of the fin under the gate. The silicon-germanium layer is then etched away making use of its etch selectivity to silicon, leaving a thinner silicon layer that can be fully silicided at the top of the fin without exceeding reasonable thermal budgets.

Note that it would not be possible to simply use a thinner polysilicon layer since that would not provide enough protection to the region of the fin under the gate from the implantation process used to implant source and drain.

The present approach fully silicides the polysilicon over the top of the fin but may leave unsilicided polysilicon away from the fin. The metal layer under the silicide layer avoids the unsilicided polysilicon coming into contact with the fin and providing an inappropriate work function. The fully silicided polysilicon at the top of the fin provides a good contact to the metal layer and a low resistance path to the gate improving the dynamic properties of the finFET.

Preferably, the same silicidation process is used to form the source/drain silicides as the gate silicide. This greatly eases the process over processes which form these silicides in separate steps. This is possible in view of the thinner polysilicon layer in the gate stack.

For a better understanding of the invention, embodiments will now be described, with reference to the accompanying drawings, in which.

The figures are schematic and not to scale. The same or like components are given the same reference numerals in different figures.

Figure 1:
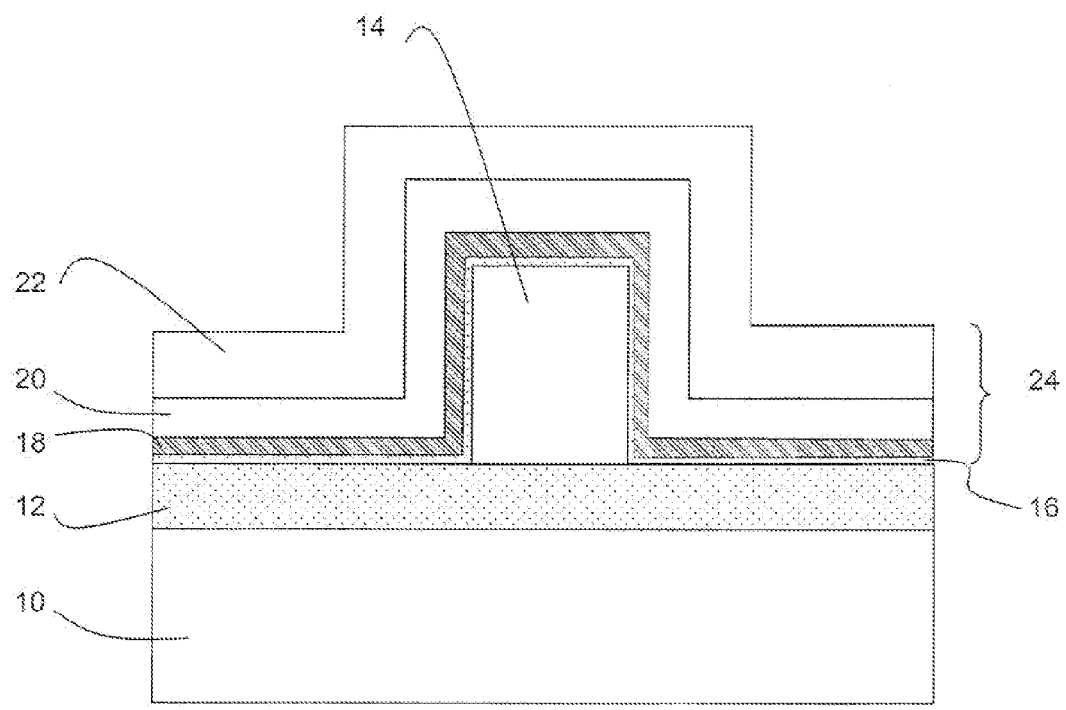
FIG. 1 shows a first step in a method according to an embodiment of the invention in side section.
Figure 2:
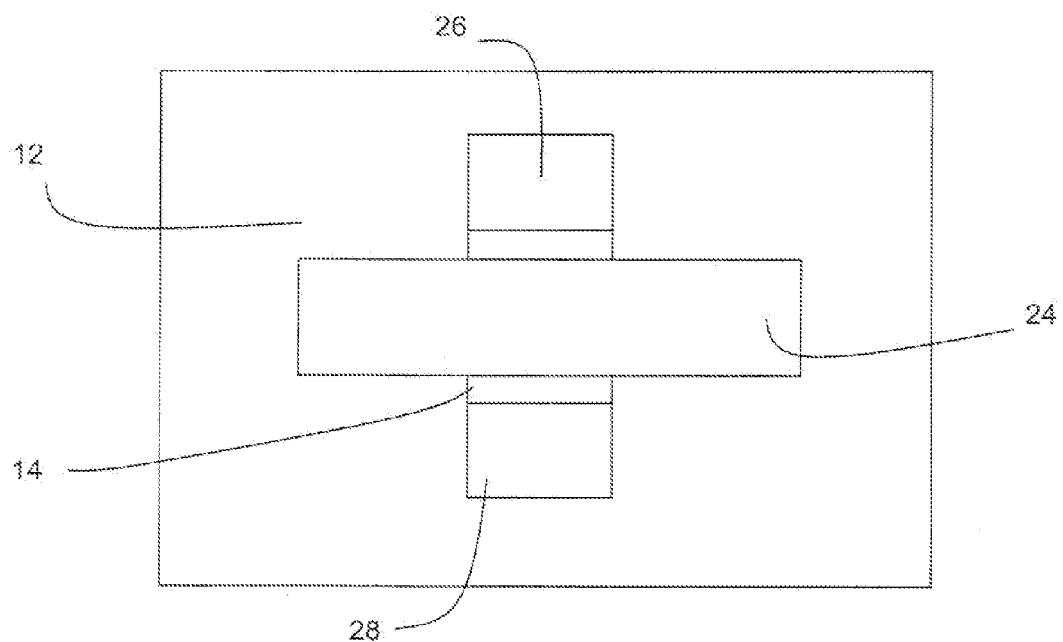
FIG. 2 shows a second step in a method according to an embodiment of the invention in top view.

Referring to FIG. 1, a buried oxide layer 12 is formed on substrate 10 and a fin 14 is formed of silicon extending longitudinally across the substrate (See FIG. 2). The manufacture of such fins is known and will not be described further.

Next, a high-k dielectric layer 16 is deposited over the full surface of the structure. For example, a hafnium oxide dielectric may be deposited to a thickness of 3 to 5 nm.

This is followed by a metal layer 18, which may be of refractory metal or a nitride or carbide of a refractory metal. The metal layer 18 may be, for example, of molybdenum or titanium nitride. Alternative materials include WTa, $TaN_x$, $TaC_x$, $TaC_xN_y$, $TaC_xO_yN_x$, Ti, $TiN_x$, $TiC_x$, $TiC_xN_y$, Hf, $HfN_x$, Mo, $MoN_x$, W, $WC_x$, $WN_x$, or $WC_xN_y$. The metal may be chosen for the correct threshold voltage.

A polysilicon cap 20 is then deposited, followed by silicon-germanium cap 22. The percentage of germanium in the silicon-germanium alloy may be for example 10% to 100%, 20% to 50% or approximately 30% which allows for good etch selectivity between silicon-germanium and the silicon in a subsequent processing step. However, the percentage may be varied as convenient.

Next, a hard mask is defined and the high-k dielectric, metal layer 18, polysilicon cap 20 and silicon-germanium cap 22 patterned to form a gate stack 24 extending laterally across the substrate over the fin, leaving the ends of the fins exposed, as shown in FIG. 2.

At this point further processes may be carried out, for example implantation at a tilt angle to implant the source 26 and drain 28 at the ends of the fin. Such further processes are known in the art and will not be described further.

The silicon-germanium cap 22 and polysilicon cap 20 protect the fin 14 under the gate stack 24 from these processes, in particular the implantation. For this reason, the thickness of the polysilicon cap 20 and silicon-germanium cap 22 together should be sufficient for this protection. Typically, the total thickness of the two cap layers together will be 60 nm to 100 nm.

A selective etch is then carried out to remove the silicon-germanium cap 22 using the polysilicon cap 20 as an etch stop. Note that this step significantly reduces the thickness of the cap.

Figure 3:
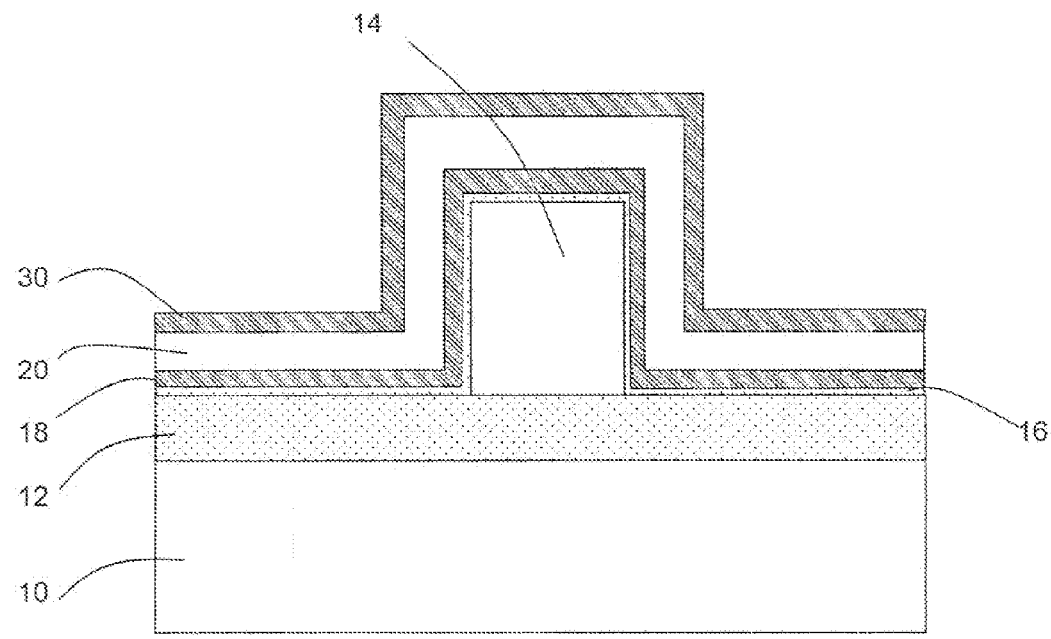
FIG. 3 shows a third step in a method according to an embodiment of the invention in side section.

A nickel layer 30 is then deposited over the surface, including over the polysilicon 20 of the gate stack 24 (now without the silicon-germanium 22), as well as the source 26 and drain 28, as shown in FIG. 3.

The sample is then annealed to react the nickel on the source 28, the drain 30 and the polysilicon 20 of the gate stack 24 to form a nickel silicide source contact 32, a nickel silicide drain contact 34, and a nickel silicide gate layer 36 respectively. Note that the silicidation process silicides the full thickness of the polysilicon 20 at the top of the fin where there is a greater availability of nickel, but at the base of the fin and in the regions where the gate stack 24 extends over the buried oxide 12 there remains an unreacted polysilicon layer 38 between the nickel silicide gate layer 36 and the metal layer 18.

Figure 4:
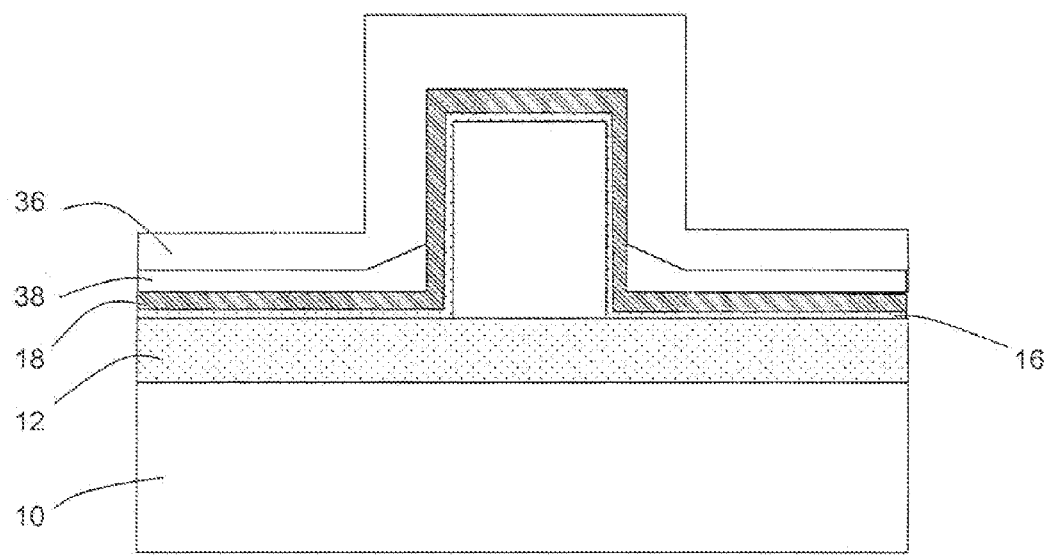
FIG. 4 shows a fourth step in a method according to an embodiment of the invention in side section.
Figure 5:
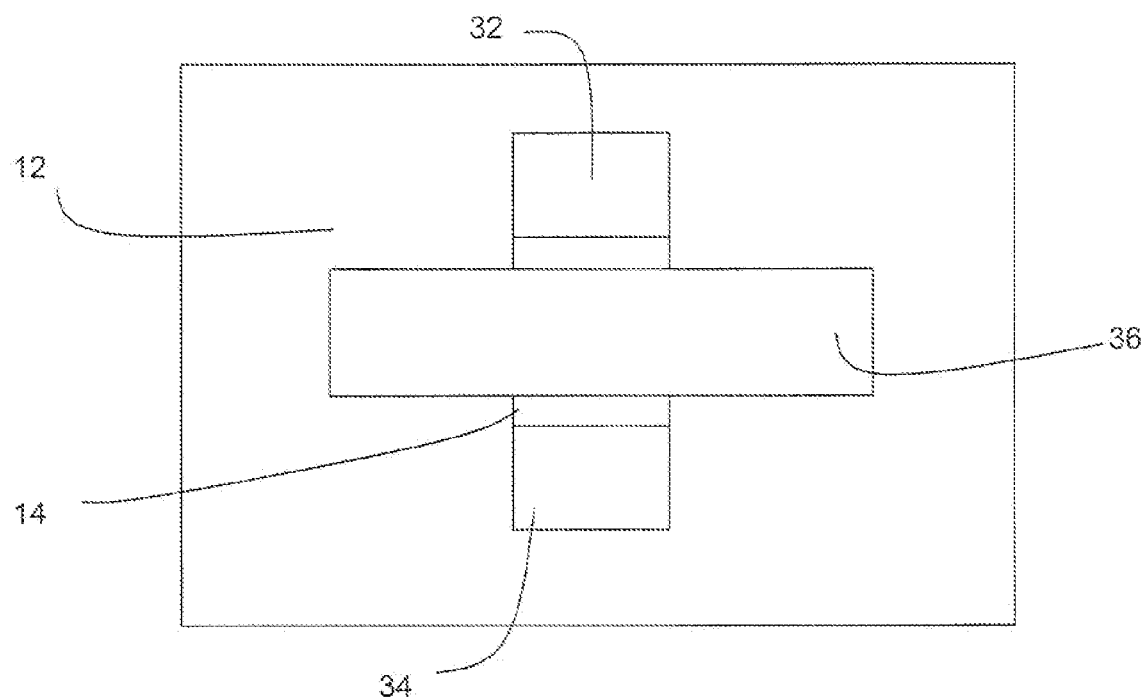
FIG. 5 shows the fourth step in a method according to an embodiment of the invention in top view.

Unreacted nickel is then etched away, leaving the structure shown in FIGS. 4 and 5.

Note that the structure proposed ensures that the metal gate layer 18 does not need to make contact with the polysilicon, even the unreacted polysilicon layer 38, as long as there is a good contact with the nickel silicide gate layer 36. Thus, the contact resistance between metal and polysilicon does not cause problems. This is in contrast to alternative devices with the metal layer is in contact just with polysilicon—in such alternative devices the interface would cause significant performance degredation.

The thickness of the polysilicon layer 20 before the silicidation process is important to avoid an excessive thermal budget and to make the gate silicidation step compatible with the silicidation step on the source and drain. For this reason, the polysilicon layer 20 has, in this embodiment, a thickness in the range 10 nm to 30 nm.

In the device of FIGS. 4 and 5, the metal layer 18 protects the fin 14 from the unreacted polysilicon 38 and hence from adverse effects on the threshold voltage.

Typically, in alternative device structures, the use of a fully-silicided gate is intended to achieve a suitable threshold voltage. In the present case, the nickel silicide gate layer 36 does not define the threshold voltage since this is largely defined by the properties of metal layer 18. Nevertheless, the nickel silicide gate layer 36 does provide an excellent low resistance path to the metal layer 18 thereby greatly improving the dynamic properties of the device.

The inclusion of metal layer 18 in the structure greatly improves the process and the device. In particular, by including metal gate layer 18 it is necessary to fully silicide the gate only over the fin and not in the regions adjacent to the fin where the unreacted polysilicon 38 remains. In the absence of the metal gate layer 18 the unreacted polysilicon would prevent correct contacting to the nickel silicide gate layer 36. Thus, the inclusion of metal layer 18 permits the benefits of a fully-silicided gate to be obtained even when the gate is not, in fact, fully silicided.

Note that the above description is intended to cover the most important aspects of the invention and those skilled in the art will realise that modifications and additions may be made to the above process.

For example, additional processing techniques may be used if required. For example, spacers may be formed on the edge of the gate, raised sources and drains may be formed, and any other suitable addition may be used.

The materials used are also not restricted to those set out above. Alternative dielectric materials may be used, for example other low-k dielectric materials.

The metal of the metal gate layer may be any suitable metal, carbide, or nitride.

The invention claimed is:

1. A method of manufacturing a finFET, comprising:
   forming a semiconductor fin extending across an insulating layer on a substrate;
   depositing a gate dielectric over the sides and top of the fin;
   depositing a metal gate layer over the gate dielectric;
   depositing a polysilicon layer over the metal gate layer;
   depositing a silicon-germanium layer over the polysilicon layer;
   patterning the metal, polysilicon layer and silicon-germanium layer to form a gate stack extending across and over the fin;
   implanting the fin to form a source and a drain;
   selectively etching away the silicon-germanium layer leaving the polysilicon layer;
   depositing a silicide-forming metal on the polysilicon layer;
   reacting the silicide-forming metal with the polysilicon to form silicide replacing the full thickness of the polysilicon layer at the top of the fin.

2. A method according to claim 1, wherein the step of reacting the silicide-forming metal with the polysilicon to form silicide leaves unreacted polysilicon at the base of the fin and on the insulating layer between the silicide forming metal and the metal layer.

3. A method according to claim 1 wherein the step of depositing a silicide-forming metal on the polysilicon also deposits the silicide forming metal on the source and drain of the fin and the step of reacting the silicide-forming metal reacts the silicide forming metal with the source and drain of the fin to form silicide source and drain contacts.

4. A method according to claim 1 wherein the silicide-forming metal is nickel.

5. A method according to claim 1 wherein the metal gate layer is a refractory metal or a carbide of a refractory metal.

6. A finFET comprising:
   a semiconductor fin extending longitudinally across an insulating layer on a substrate;
   a gate stack over the sides and top of the fin including a gate dielectric, and a gate electrode extending laterally across the fin over the gate dielectric;
   wherein the gate electrode includes a metal gate layer over the gate dielectric and
   a metal silicide layer directly on the metal gate layer at the top of the fin, with a polysilicon region between the metal silicide layer and the metal gate layer at the base of the fin and over the insulating layer.

7. A finFET according to claim 6, further comprising a metal silicide layer over source and drain regions on the fin, wherein the metal of the metal silicide layer over the source and drain regions is the same metal as the metal of the metal silicide layer over the metal gate layer.

8. A finFET according to claim 6 wherein the thickness of the metal silicide layer over the top of the fin is 100 nm or less.

* * * * *